(12) United States Patent
Turner et al.

(10) Patent No.: US 7,678,665 B2
(45) Date of Patent: Mar. 16, 2010

(54) DEEP STI TRENCH AND SOI UNDERCUT ENABLING STI OXIDE STRESSOR

(75) Inventors: Michael D. Turner, San Antonio, TX (US); Suresh Venkatesan, Austin, TX (US); Kurt H. Junker, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 129 days.

(21) Appl. No.: 11/716,058

(22) Filed: Mar. 7, 2007

(65) Prior Publication Data

US 2008/0220617 A1 Sep. 11, 2008

(51) Int. Cl.
*H01L 21/76* (2006.01)
*H01L 29/06* (2006.01)

(52) U.S. Cl. ............... 438/436; 257/623; 257/E29.021; 257/E21.618; 257/E21.564; 438/789

(58) Field of Classification Search ................. 438/753, 438/436, 435, 789; 257/E21.546, 623, E21.618, 257/E21.564, E21.628, E21.633, E21.642, 257/E29.021, E29.018, E29.02
See application file for complete search history.

(56) References Cited

U.S. PATENT DOCUMENTS

| | | | |
|---|---|---|---|
| 5,872,401 A | 2/1999 | Huff et al. | |
| 6,013,584 A | 1/2000 | M'Saad | |
| 6,174,808 B1 | 1/2001 | Jang et al. | |
| 6,255,232 B1 | 7/2001 | Chang et al. | |
| 6,541,382 B1 * | 4/2003 | Cheng et al. | 438/692 |
| 6,621,131 B2 * | 9/2003 | Murthy et al. | 257/408 |
| 7,012,028 B2 | 3/2006 | Bu et al. | |
| 2004/0038533 A1 * | 2/2004 | Liang | 438/689 |
| 2004/0113174 A1 * | 6/2004 | Chidambarrao et al. | 257/200 |
| 2005/0255667 A1 | 11/2005 | Arghavani et al. | |
| 2006/0255330 A1 * | 11/2006 | Chen et al. | 257/18 |
| 2007/0018205 A1 * | 1/2007 | Chidambarrao et al. | 257/288 |
| 2007/0020867 A1 * | 1/2007 | Ieong et al. | 438/301 |

* cited by examiner

*Primary Examiner*—Caridad M Everhart
(74) *Attorney, Agent, or Firm*—John A. Fortkort; Fortkort & Houston P.C.

(57) ABSTRACT

A method for imparting stress to the channel region of a transistor is provided. In accordance with the method, a semiconductor layer (307) is provided which has a dielectric layer (305) disposed beneath it. A trench (319) is created which extends through the semiconductor layer and into the dielectric layer, and the trench is backfilled with a stressor material (320), thereby forming a trench isolation structure. A channel region (326) is defined in the semiconductor layer adjacent to the trench isolation structure.

31 Claims, 6 Drawing Sheets

DEEP STI TRENCH AND SOI UNDERCUT ENABLING STI OXIDE STRESSOR

FIELD OF THE DISCLOSURE

The present disclosure relates generally to semiconductor devices, and more specifically to methods for making semiconductor devices with strained channel regions.

BACKGROUND OF THE DISCLOSURE

The use of a thin layer of strained silicon in the channel layer of CMOS devices has been found to improve the performance characteristics of these devices. The presence of strain in the channel layer causes the individual silicon atoms within that layer to be forced farther apart or closer together in their lattice structure than would be the case in the unstrained material. The larger or smaller lattice spacing results in a change in the electronic band structure of the device such that current carriers (i.e., electrons and holes) have higher mobilities within the channel layer, thereby resulting in higher currents in the transistor and faster circuit speeds.

In CMOS devices, strained channel layers may be achieved by imparting local mechanical stresses to the device. Electron mobility, and therefore NMOS performance, may be improved by imparting tensile stress along (i.e., parallel to) the direction of current flow or orthogonal to the direction of current flow. Hole mobility, and therefore PMOS performance, may be enhanced by imparting compressive stress parallel to the direction of current flow, and by imparting tensile stress perpendicular to the direction of current flow.

DETAILED DESCRIPTION

In one aspect, a method for imparting stress to the channel region of a semiconductor device is provided. In accordance with the method, a semiconductor layer is provided which has a dielectric layer disposed underneath it. A trench is created which extends through the semiconductor layer and into the dielectric layer. The trench is then backfilled with a stressor material, and a channel region is created adjacent to the backfilled trench.

In another aspect, a method for imparting stress to the channel region of an SOI transistor is provided. In accordance with the method, a semiconductor stack is provided which contains a semiconductor substrate, a buried oxide layer, an SOI layer, and a hard mask. A first trench is created which extends through the hard mask and the SOI layer and which exposes a portion of the oxide layer. A portion of the oxide layer is removed with an etch which undercuts the SOI layer, thereby forming a second trench. The second trench is backfilled with a stressor material, thereby forming a shallow trench isolation (STI) structure.

In still another aspect, a semiconductor device is provided which comprises (a) a semiconductor stack containing first and second semiconductor layers and having a dielectric layer disposed between them; (b) a channel region defined in said first semiconductor layer; and (c) a shallow trench isolation (STI) structure which is adjacent to said channel region and which extends through said first semiconductor layer and into said dielectric layer; wherein said STI structure imparts stress to said channel region.

One method that may be used to impart strain to the channel region of a transistor, and in particular to the channel region of an NMOS transistor, is through the use of STI structures that undergo shrinkage during densification to impart tensile stress to the active regions of the device. However, while this approach may be suitable for inducing channel stress in bulk devices, the results achieved in analogous SOI devices has proven to be less satisfactory.

Without wishing to be bound by theory, this is believed to be due to the relatively smaller volume of the STI material that undergoes shrinkage in an SOI device as compared to a bulk device. In particular, in SOI devices, the semiconductor islands containing the channel regions of the device are much shallower than in corresponding bulk devices, and consequently, the STI structures themselves in such devices are typically shallower and hence have a significantly smaller volume. As a result of their reduced volume, any shrinkage of the STI structures attendant to densification is typically much smaller in an SOI device than in a bulk device, and hence the tensile stress imparted by the STI structures is significantly reduced.

It has now been found that the aforementioned problem may be addressed by creating an STI trench which extends into the (typically oxide) electrically insulating layer of an SOI structure. The resulting STI trench is deeper, and hence the volume of STI backfill material is greater, than would be the case if the trench were defined by an etch which stops on the oxide layer. Moreover, through the use of suitable isotropic etching, the trench can be made to undercut the SOI layer, thereby further increasing the tensile stress imparted to the channel region of an SOI NMOS transistor which incorporates the channel region.

The devices and methodologies disclosed herein may be appreciated by first considering the prior art method disclosed in FIGS. 1-5, which depict a known shallow trench isolation (STI) process utilized to form an SOI structure in a bulk wafer.

Figure 1:
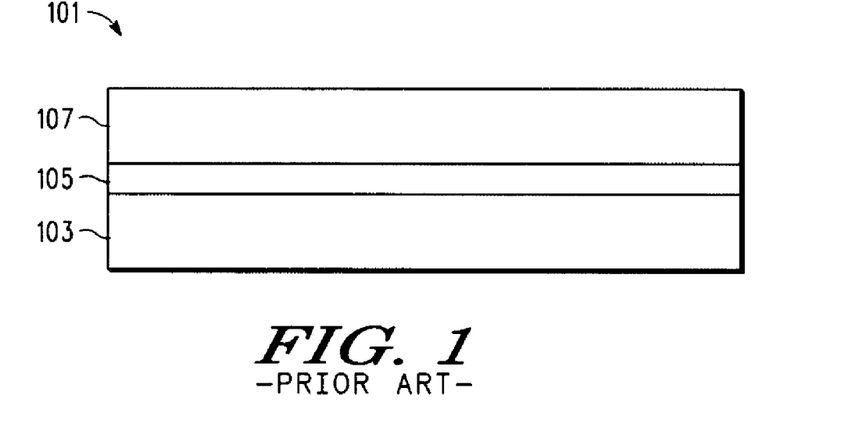
FIG. 1 is an illustration of a step in a prior art process for producing a transistor having a strained channel region.

As shown in FIG. 1, the process begins with a layer stack 101 comprising a nitride layer 107, a pad oxide layer 105, and a semiconductor substrate 103. The semiconductor substrate 103 may be, for example, a silicon substrate.

Figure 2:
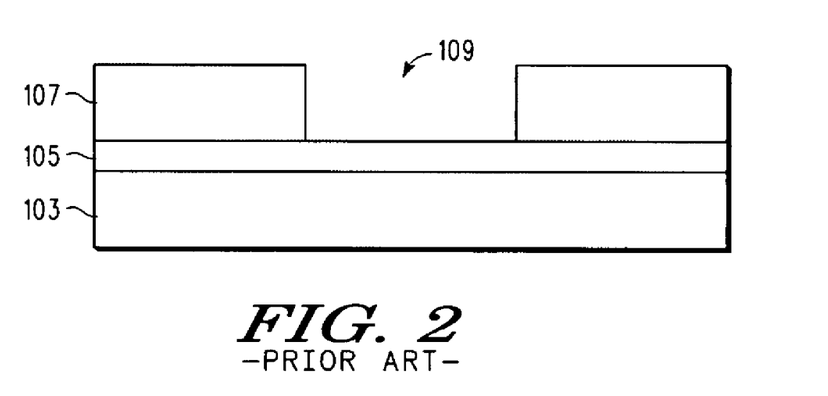
FIG. 2 is an illustration of a step in a prior art process for producing a transistor having a strained channel region.

FIG. 2 shows the formation of a first trench 109 in the nitride layer 107. The first trench 109 may be formed by depositing and patterning a photoresist layer (not shown) on the nitride layer 107 such that a portion of the nitride layer 107 overlying the first trench 109 is exposed. A nitride etch is then utilized to remove the exposed portion of the nitride layer 107 and to form the first trench 109, and the layer of photoresist is stripped.

Figure 3:
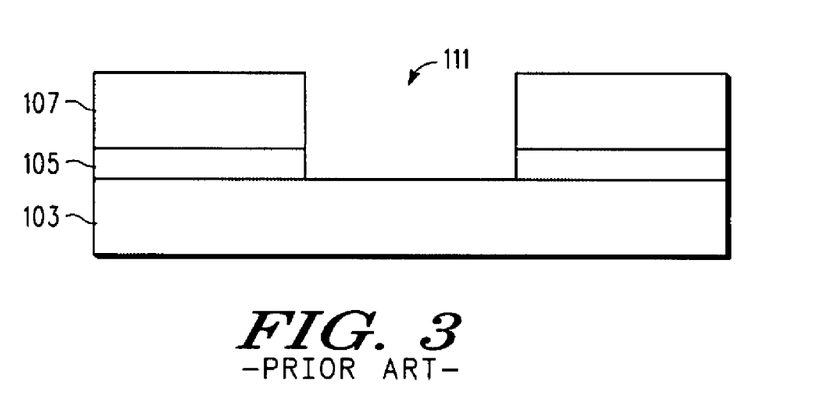
FIG. 3 is an illustration of a step in a prior art process for producing a transistor having a strained channel region.
Figure 4:
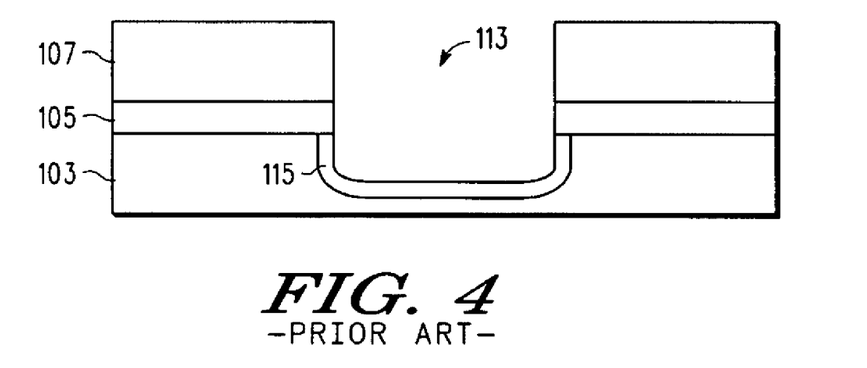
FIG. 4 is an illustration of a step in a prior art process for producing a transistor having a strained channel region.

Referring now to FIG. 3, the nitride layer 107 is utilized as a hard mask during a subsequent oxide etch which is utilized to remove the exposed portion of the pad oxide layer 105, thereby forming a second trench 111. The exposed portion of the substrate 103 is then etched to form a third trench 113 which extends into the substrate 103 (see FIG. 4). If the substrate 103 is silicon, a silicon etch may be used for this process. Following the substrate etch, the third trench 113 that is formed may be cleaned with cleaning agents, and a trench side wall liner 115 may be formed in trench 113 through, for example, a rapid thermal oxidation (RTO) in an oxide/oxynitride atmosphere. Such a process may also serve to round the corners of the trench 113.

Figure 5:
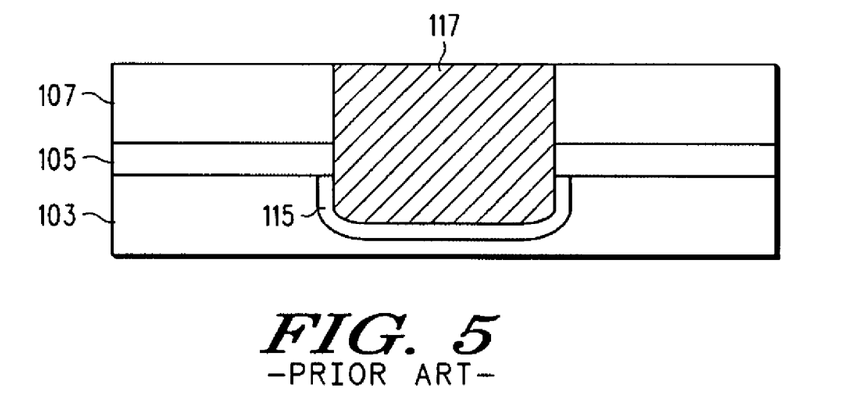
FIG. 5 is an illustration of a step in a prior art process for producing a transistor having a strained channel region.

After the trench 113 is formed, a tensile stressor material 117 may be deposited in the third trench 113 as shown in FIG. 5. The tensile stressor material 117 may be deposited using a TEOS (tetraethoxy silane)/ozone process. Thus, for example, if the tensile material 117 is a silicon oxide material, the process may include using a sub-atmospheric chemical vapor deposition (SACVD) trench fill process based on $O_3$/TEOS.

After deposition of the tensile stressor material 117, the tensile stressor material 117 may be subjected to an anneal. This annealing may be a furnace anneal, typically conducted at an annealing temperature of 750° C. to about 1200° C., or a Rapid Thermal Process (RTP) anneal, typically conducted at an anneal temperature of up to about 1200° C. Such an anneal may be conducted in an atmosphere of $N_2$, $N_2O$, NO or $NH_3$.

Figure 6:
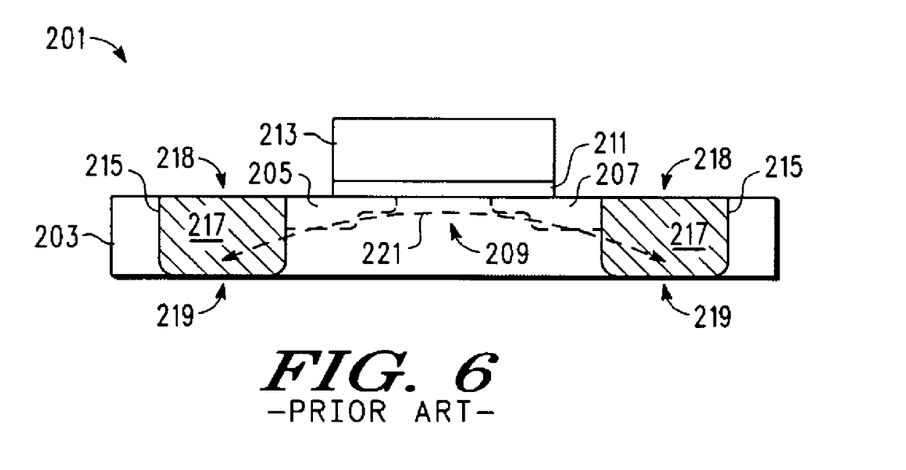
FIG. 6 is an illustration of a prior art transistor.

FIG. 6 shows a simplified cross-section of a transistor 201 which is made in accordance with the foregoing process. The dashed line segment 221 indicates the directionality of the tensile stresses created in the channel region 209 by the deposition of the tensile stressor materials 217 in the trenches 215. The pair of trenches 215 are located in the semiconductor substrate 203 adjacent to the source region 205 and drain region 207, respectively, which define opposite ends of channel region 209 located under gate oxide 211 and gate electrode 213.

The trenches 215 include a top end 218 and a bottom end 219. Following the deposition of the tensile stressor materials 217, an anneal may be performed that creates a tensile stress gradient in the tensile stressor materials 217. The resulting tensile stress in the channel region 209 may have both a latitudinal component that is collinear (or coplanar) with a top surface of the semiconductor substrate 203, and a longitudinal component that is collinear (or coplanar) with the direction from the top end 217 to the bottom end 219 of the trenches 215. As shown in FIG. 6, the sum of the latitudinal and longitudinal stress components creates tensile stress 221 in the channel region 209. Stresses from other sources may also be present in the channel region 209, so tensile stress 221 may not represent the total tensile stress in the channel region 209.

While the methodology depicted in FIGS. 1-6 may have some desirable attributes, it has been found that this methodology does not translate well going from bulk devices to semiconductor-on-insulator (SOI) devices. As noted above, this is believed to be due to the shallower STI structures typically incorporated into SOI devices and the attendant reduced volume, and correspondingly smaller tensile stress, imparted by the STI structures as noted above. This infirmity may be addressed by the methodologies disclosed herein, which may be further appreciated with respect to the first particular, non-limiting embodiment thereof disclosed in FIGS. 7-10.

Figure 7:
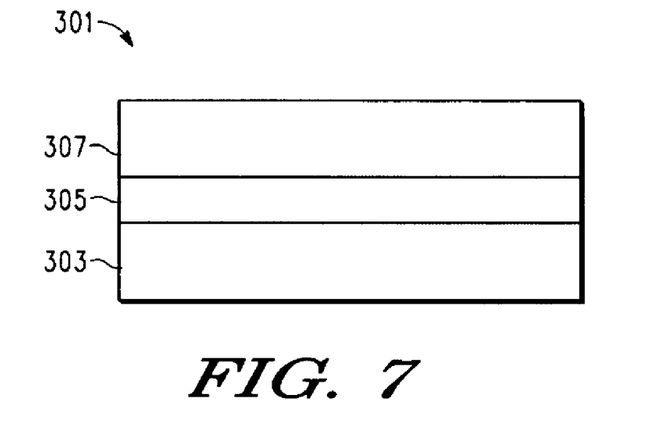
FIG. 7 is an illustration of a step in a process in accordance with the teachings herein for producing a transistor having a strained channel region.

With reference to FIG. 7, a structure 301 is provided which comprises a substrate 303 which preferably contains (110) silicon and upon which is disposed an insulating layer 305 (in this particular embodiment, a buried oxide (BOX) layer) and an SOI layer 307, the later of which preferably comprises (100) silicon. In some embodiments, the substrate 303 and the insulating layer 305 may be replaced with a single insulating layer or substrate.

Figure 8:
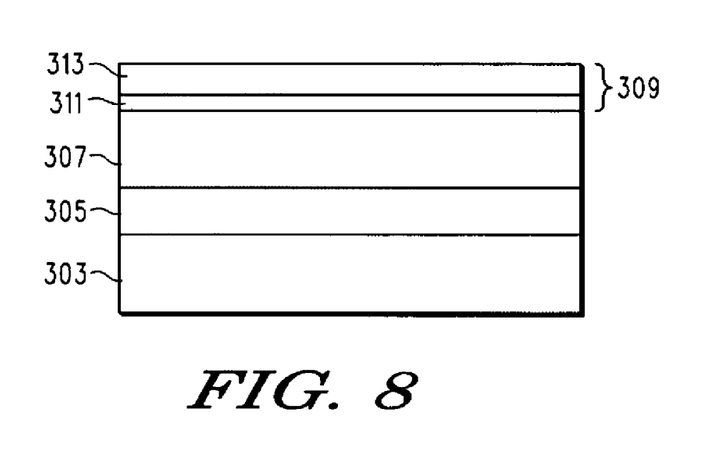
FIG. 8 is an illustration of a step in a process in accordance with the teachings herein for producing a transistor having a strained channel region.
Figure 9:
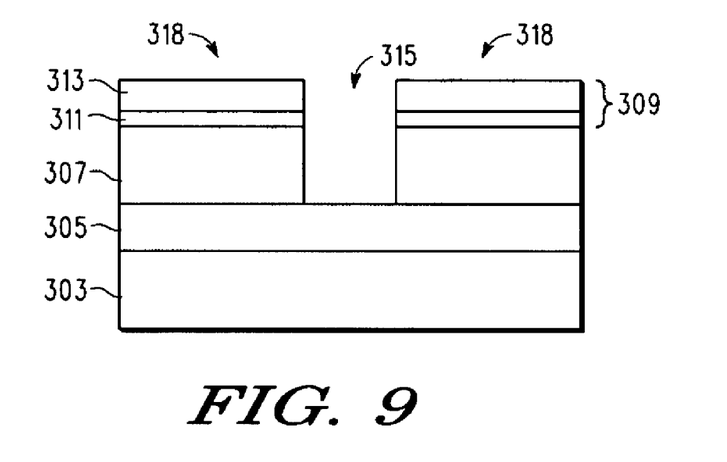
FIG. 9 is an illustration of a step in a process in accordance with the teachings herein for producing a transistor having a strained channel region.

As shown in FIG. 8, a hard mask 309 is formed over the structure. The hard mask 309 preferably comprises a layer of pad oxide 311 over which is deposited a layer of nitride 313. As shown in FIG. 9, the hard mask 309 is then patterned to expose a portion of the underlying SOI layer 307, and the exposed portion of the SOI layer 307 is removed by etching to define a first trench 315 therein which extends to the BOX layer 305. The BOX layer 305 may be used as an etch stop in this process, and the etch is preferably a dry plasma etch using a suitable fluorocarbon or fluorocarbon mixture. In some embodiments, the trench may be extended into or through the BOX layer 305.

Figure 10:
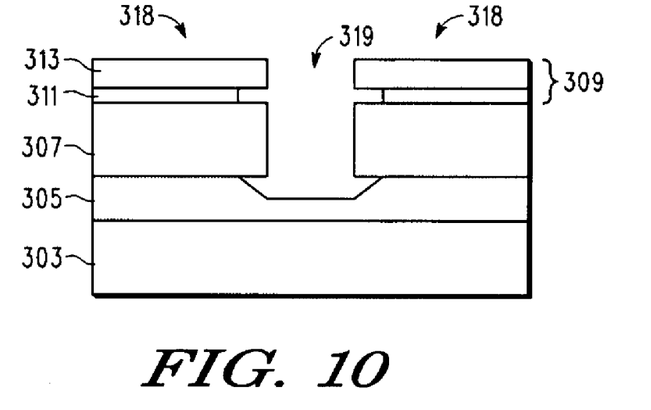
FIG. 10 is an illustration of a step in a process in accordance with the teachings herein for producing a transistor having a strained channel region.
Figure 11:
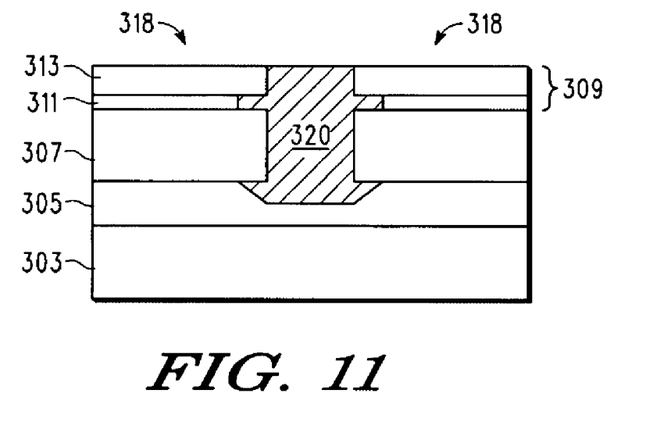
FIG. 11 is an illustration of a step in a process in accordance with the teachings herein for producing a transistor having a strained channel region.

Referring now to FIG. 10, the structure is then subjected to an etch which removes a portion of the pad oxide 311 and a portion of the BOX layer 305, and which preferably undercuts the SOI layer 307 as shown, thereby forming a second trench 319. The etch used for this purpose is preferably a wet etch, such as an aqueous HF etch, which is essentially isotropic and highly selective to oxide. As shown in FIG. 11, the second trench 319 is then backfilled with a suitable stressor material 320 which, in the case of an NMOS transistor, is preferably a tensile stressor.

The deposition of the stressor material 320 is preferably followed by densification. Various suitable densification techniques may be utilized for this purpose, including, for example, annealing the stressor material 320 in an oxygen atmosphere at a temperature within the range of about 900° C. to about 1200° C. for 30-90 minutes. In some embodiments, the deposition of the stressor material 320 may be followed by CMP, either before or after densification, so that the surface of the stressor material 320 is coplanar with the surface of the hard mask 309.

Figure 12:
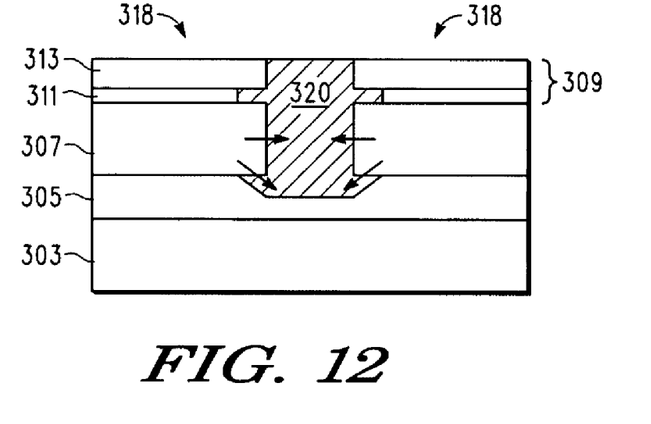
FIG. 12 is an illustration depicting the directionality of stress imparted to a channel region by an STI structure made in accordance with the teachings herein.

FIG. 12 depicts the directionality of the tensile stress in the resulting device. As seen therein, the resulting tensile stress in the tensile stressor material 320 may have both a latitudinal component and a longitudinal component. As a result of the undercutting of the SOI layer 307, the depth of the trench, and the corresponding increase in volume of the stressor material 320, the tensile stress imparted to the channel region of an NMOS transistor by an STI structure incorporating the tensile stressor material 320 may be significantly enhanced, which may in turn significantly improve the performance characteristics of the transistor.

Figure 13:
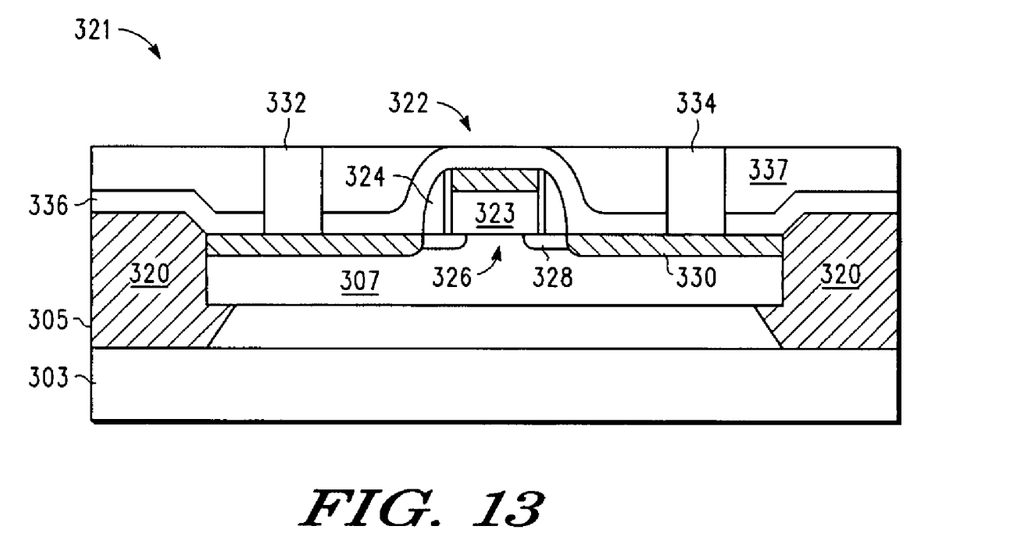
FIG. 13 is a transistor made in accordance with the process depicted in FIGS. 7-11.

FIG. 13 illustrates a completed NMOS transistor that incorporates STI structures of the type described herein. As seen therein, the NMOS transistor 321 includes a gate structure 322 comprising a gate electrode 323 and adjacent spacer structures 324. A channel region 326 extends beneath the gate electrode 323 and between implant regions 328 and 330. The implant regions 330 which form portions of the source and drain regions of the NMOS transistor 321 are typically at least partially salicided and have contacts 332 and 334 associated with them.

Note that, prior to formation of the gate structure 322 (but typically after the device has been subjected to CMP), hard mask 309 (see FIG. 12) is removed with a suitable wet etch. After the gate structure 322 is formed, an etch stop layer 336 is deposited over the structure, and a suitable dielectric material 337 is deposited over the structure. The dielectric material 337 is then planarized as shown. As previously discussed, in the completed device, strain is applied to the channel region 326 by the STI structures 320.

Figure 14:
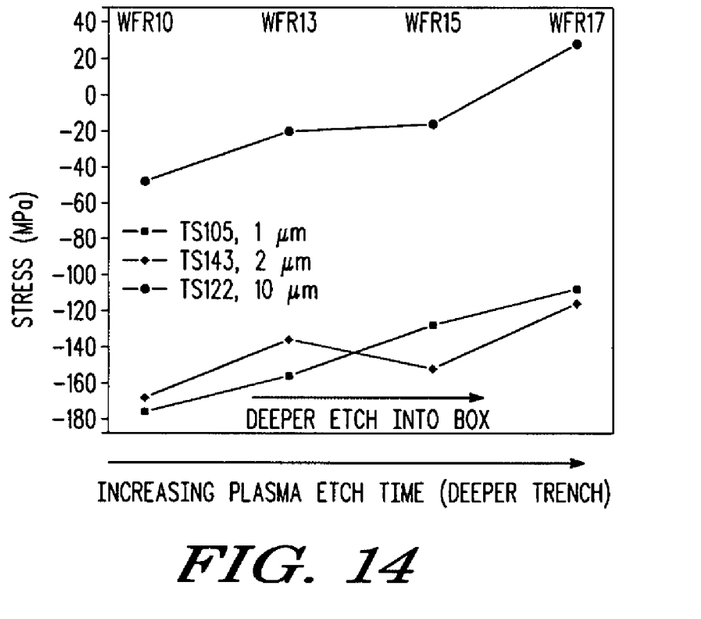
FIG. 14 is a graph of stress as a function of the depth an STI structure extends into an insulating layer (in this case, a buried oxide or "BOX" layer)

FIG. 14 illustrates the improvements in tensile stress which may be realized with SOI devices made in accordance with the teachings herein in which the STI trench extends into the BOX layer of the transistor. In particular, FIG. 14 shows the results of tensile stress (determined form Raman spectroscopy) as a function of STI trench depth for a set of NMOS transistors. As seen therein, tensile stress increases with increasing plasma etch time, and therefore, increasing STI trench depth.

In the preferred embodiment of the processes described herein, the stressor material 320 (see FIG. 13) is formed through an SACVD trench fill process based on $O_3$/TEOS, and the deposited oxide is cured through exposure to a UV radiation source (in some embodiments, an ebeam source may be used for the curing process instead). Without wishing to be bound by theory, this curing process is believed to involve dehydration of silanol moieties in the fill material to form siloxane linkages as indicated in REACTION 1 below:

(REACTION I)

The use of UV curing of the fill material is advantageous in some embodiments in that the curing process may be implemented at relatively low temperatures (typically 400° C. or less). By comparison, the use of a furnace anneal (typically conducted at an annealing temperature of 750° C. to about 1000° C.) or an RTP anneal (typically conducted at an anneal temperature of up to about 1200° C.) involve much higher temperatures. Hence, UV curing reduces the thermal profile that the components of the device are exposed to, and reduces or eliminates the risk of plasma damage.

Figure 15:
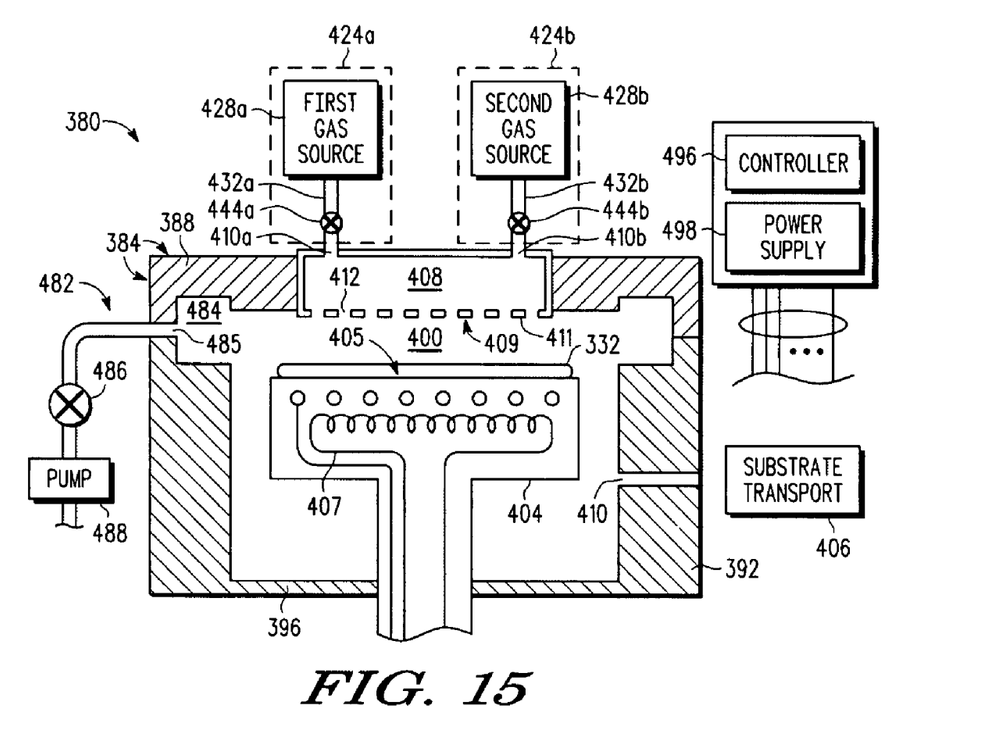
FIG. 15 is an illustration of a process chamber that may be utilized to produce the STI structures described herein.

Various substrate process chambers may be used to implement the methodology described herein and, in particular, the SACVD deposition process and the subsequent UV curing process (here it is to be noted that the UV curing may be conducted in the same process chamber or in a different process chamber or tool). One particular, non-limiting embodiment of such a substrate process chamber 380 that can be used for this purpose is depicted in FIG. 15. The particular chamber 380 depicted therein is a plasma enhanced chemical vapor deposition (PECVD) chamber which is suitable for processing a semiconductor substrate 332, such as a silicon wafer. The chamber 380 comprises enclosure walls 384, which include a ceiling 388, sidewalls 392, and a bottom wall 396 which enclose a process zone 400.

During a typical process cycle, the substrate support 404 is lowered, and a substrate 332 is then passed through an inlet port 410 and is placed on the support 404 by a robotic arm or other suitable substrate transport 206. The substrate support 206 is adapted to be moved between a lower position for loading and unloading, and an upper position for processing of the substrate 332.

The substrate support 404 may include an enclosed electrode 405 to generate a plasma from a process gas stream which is introduced into the chamber 380. The substrate support 404 is also typically equipped with a heater 407 which, in the particular embodiment depicted, comprises an electrically resistive heating element. The substrate support 404 typically includes a ceramic structure which has a receiving surface to receive the substrate 332, and which protects the electrode 405 and heater 407 from the chamber environment. In use, a radio frequency (RF) voltage is applied to the electrode 405, and a direct current (DC) voltage is applied to the heater 407.

After a substrate 332 is loaded onto the support 404, the support 404 is raised to a suitable processing position with respect to the gas distributor 408 such that a desired spacing gap distance $d_s$ is attained. The spacing gap distance is typically from about 2 mm to about 12 mm. The gas distributor 408 is disposed above the process zone 400, and is adapted to disperse a process gas stream uniformly across the substrate 332. The gas distributor 408 may also be adapted to separately deliver two independent streams of first and second process gases to the process zone 400 without mixing the gas streams prior to their introduction into the process zone 400, and may also be adapted to premix the process gases prior to their introduction into the process zone 400.

The gas distributor 408 comprises a faceplate 411 having holes 412 therein that allow the passage of the process gas stream therethrough. The substrate process chamber 380 also comprises first and second gas supplies 424a, 424b to deliver the first and second process gas to the gas distributor 408, the gas supplies 424a, 424b each comprising a gas source 428a, 428b, one or more gas conduits 432a, 432b, and one or more gas valves 444a, 444b.

The process gas stream may be energized to form a plasma by coupling electromagnetic energy, such as high frequency voltage energy, to the process gas. To energize the first process gas, a voltage is applied between (i) the electrode 405 in the support 404, and (ii) a second electrode 409 which may be the gas distributor 408, ceiling 388 or chamber sidewall 392. The voltage applied across the pair of electrodes 405, 409 capacitively couples energy to the process gas in the process zone 400.

Typically, the voltage applied to the electrode 405, 409 is at a radio frequency within the range of from about 3 kHz to about 300 GHz. The selected radio frequency voltage is applied to the first electrode 405 at a power level of from about 10 W to about 1000 W, and the second electrode 409 is typically grounded. However, the particular radio frequency range that is used, and the power level of the applied voltage, may depend upon the particulars of the stressed material to be deposited.

The chamber 380 is also equipped with a gas exhaust 482 to remove spent process gas and byproducts from the chamber 380 and maintain a predetermined pressure of process gas in the process zone 400. In the particular device depicted, the gas exhaust 482 includes a pumping channel 484 that receives spent process gas from the process zone 400, an exhaust port 485, a throttle valve 486, and one or more exhaust pumps 488 to control the pressure of process gas in the chamber 380.

A controller 496 is also provided to control the activities and operating parameters of the chamber 380. The controller 496 may comprise, for example, a processor and memory. The processor is typically adapted to execute chamber control software, such as a computer program stored in the memory. The chamber control software typically includes sets of instructions that dictate the timing, mixture of gases, chamber pressure, chamber temperature, microwave power levels, high frequency power levels, support position, and other parameters of a particular process.

The chamber 380 also comprises a power supply 498 to deliver power to various chamber components such as, for example, the first electrode 405 in the substrate support 404 and the second electrode 409 in the chamber. To deliver power to the chamber electrodes 405, 409, the power supply 498 comprises a radio frequency voltage source that provides a voltage having the selected radio frequencies and the desired selectable power levels.

The power supply 498 may include a single radio frequency voltage source, or multiple voltage sources that provide both high and low radio frequencies. The power supply 498 and also include an RF matching circuit. The power supply 498 may further comprise an electrostatic charging source to provide an electrostatic charge to an electrode often electrostatic chuck in the substrate support 404.

The substrate process chamber 380 may also comprise a temperature sensor (not shown), such as a thermocouple or an interferometer, to detect the temperature of surfaces, such as component surfaces or substrate surfaces, within the chamber 380. The temperature sensor will typically be adapted to relay the data it collects to the chamber controller 496. The chamber controller 496 may then use this temperature data to control the temperature of the process chamber 380, for example, by controlling the resistive heating element in the substrate support 404.

Figure 16:
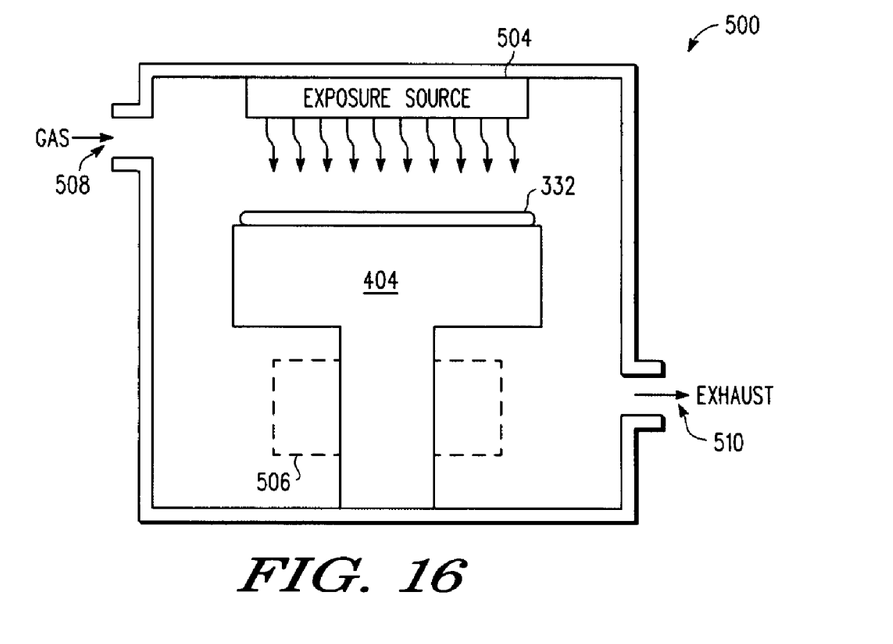
FIG. 16 is an illustration of an exposure source that may be used in conjunction with the process chamber of FIG. 14.

FIG. 16 shows an exemplary embodiment of an exposure chamber 500 which can be used to expose a substrate 332 to ultraviolet radiation in accordance with the teachings herein. In the particular embodiment depicted, the chamber 500 includes a substrate support 404 which is moveable between a released position distal from the exposure source 504, and a lifted position proximate to the exposure source 504. The substrate support 404 supports the substrate 332 in the chamber 500. During insertion and removal of the substrate 332 from the exposure chamber 500, the substrate support 404 may be moved to a loading position, and thereafter, during exposure of the substrate 332, the support 404 may be raised into the lifted position to maximize exposure levels. The chamber 500 further comprises a heater 506, such as a resistive element or a radiative heat source, which may be used to heat the substrate 132 to a desired temperature during exposure of the substrate 332. A gas inlet 508 is provided to introduce a gas into the exposure chamber 500, and a gas outlet 510 is provided to exhaust the gas from the exposure chamber 500.

The exposure chamber 500 further includes a suitable UV radiation source 504. The UV radiation source 504 may emit a single ultraviolet wavelength, or a broadband of ultraviolet wavelengths. A suitable single wavelength ultraviolet source may comprise an excimer ultraviolet source that provides a single ultraviolet wavelength of 172 nm or 222 nm. A suitable broadband source may be utilized which is adapted to generate ultraviolet radiation having wavelengths of from about 200 to about 400 nm.

The stressed material may be exposed to ultraviolet radiation having other wavelengths that are generated by lamps containing gases that radiate at specific wavelengths when electrically stimulated. For example, suitable ultraviolet lamps may comprise Xe gas, which generates ultraviolet radiation having a wavelength of 172 nm. In other embodiments, the lamp may comprise other gases having different corresponding wavelengths. Thus, for example, mercury lamps radiate at a wavelength of 243 nm, deuterium lamps radiate at a wavelength of 140 nm, and $KrCl_2$ lamps radiate at a wavelength of 222 nm.

Generation of ultraviolet radiation specifically tailored to modify the stress value in the deposited stressed material may also be accomplished by introducing a mixture of gases into the lamp, each gas capable of emitting radiation of a characteristic wavelength upon excitation. By varying the relative concentration of the gases, the wavelength content of the output from the radiation source can be selected to simultaneously expose all of the desired wavelengths, thus minimizing the necessary exposure time. The wavelength and intensity of the ultraviolet radiation can be selected to obtain predetermined tensile stress values in the deposited (preferably silicon nitride) stressor material.

The CVD deposition chamber 380 and exposure chamber 500 may also be integrated together on a multi-chamber process platform (not shown) served by a single robotic arm. The exposure source 504 and the support of the exposure chamber 500, and the components of the CVD deposition chamber 380 that include the substrate support 404, motor, valves or flow controllers, gas delivery system, throttle valve, high frequency power supply, and heater 506, and the robotic arm of the integrated processing system, may all be controlled by a system controller over suitable control lines. The system controller relies on feedback from optical sensors to determine the position of movable mechanical assemblies such as the throttle valve and substrate support 404 which are moved by appropriate motors under the control of the controller.

For exposure treatment in the described exposure chamber 500, a substrate having a stressor material thereon is inserted into the exposure chamber 500 and placed upon the substrate support 404 in the lowered position. The substrate support 404 is then raised to a lifted position, the optional heater 506 in the support powered on, and the exposure source 504 is activated. During exposure, a gas may be circulated through the exposure chamber 500, such as helium or nitrogen, to improve thermal heat transfer rates between the substrate and the support. Other gases may also be used. After a period of radiation exposure, the exposure source 504 is deactivated and the substrate support 404 is lowered back into the released position. The substrate bearing the exposed silicon nitride stressed material is then removed from the exposure chamber 500.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for imparting stress to the channel region of a semiconductor device, comprising:
   providing a semiconductor layer disposed on an insulating layer;

creating a trench which extends through the semiconductor layer and into the insulating layer;
backfilling the trench with a stressor material; and
creating a channel region adjacent to the backfilled trench;
wherein the step of backfilling the trench results in the formation of a trench isolation structure.

2. The method of claim 1, wherein the stressor material is a tensile stressor.

3. The method of claim 1, wherein the insulating layer comprises an oxide.

4. The method of claim 1, wherein the semiconductor device is an NMOS transistor.

5. The method of claim 1, further comprising:
subjecting the stressor material to densification.

6. The method of claim 5, wherein the stressor material imparts tensile stress by undergoing shrinkage during densification.

7. The method of claim 1, wherein the semiconductor layer has a hard mask disposed thereon, and wherein the trench extends through the hard mask.

8. The method of claim 7, wherein the hard mask comprises a layer of pad oxide having a layer of silicon nitride disposed thereon.

9. The method of claim 1, wherein creating the trench removes a portion of the insulating layer which extends underneath the semiconductor layer.

10. The method of claim 9, wherein backfilling the trench causes the stressor material to extend underneath the semiconductor layer.

11. A method for imparting stress to the channel region of an SOI transistor, comprising:
providing a semiconductor stack containing a buried oxide layer, an SOI layer, and a hard mask;
creating a first trench which extends through the hard mask and the SOI layer and which exposes a portion of the oxide layer;
removing a portion of the oxide layer with an etch that undercuts the SOI layer, thereby forming a second trench; and
backfilling the second trench with a stressor material, thereby forming a trench isolation structure.

12. The method of claim 11 wherein, after the trench isolation structure is formed, the stressor material is subjected to densification.

13. The method of claim 11, wherein the second trench is backfilled such that the stressor material extends underneath the SOI layer.

14. The method of claim 11, wherein the transistor has a channel region, and wherein the channel region is formed in the SOI layer adjacent to the trench isolation structure.

15. The method of claim 14, wherein the stressor material imparts tensile stress to the channel region of the transistor.

16. A semiconductor device, comprising:
a semiconductor layer having an insulating layer disposed underneath it;
a channel region defined in said semiconductor layer; and
a trench isolation structure which is adjacent to said channel region and which extends through said first semiconductor layer and into said insulating layer;
wherein said trench isolation structure imparts stress to said channel region wherein said trench isolation structure undercuts the semiconductor layer.

17. The semiconductor device of claim 16, wherein said semiconductor device is an NMOS transistor, and wherein said trench isolation structure imparts tensile stress to said channel region.

18. A method for imparting stress to the channel region of a semiconductor device, comprising:
providing a semiconductor layer disposed on an insulating layer;
creating a trench which extends through the semiconductor layer and into the insulating layer, wherein the trench is formed by (a) using a first etch to create an opening which extends through the semiconductor layer and which exposes a portion of the insulating layer, and (b) using a second etch to remove a portion of the insulating layer;
backfilling the trench with a stressor material; and
creating a channel region adjacent to the backfilled trench.

19. The method of claim 18, wherein the second etch undercuts the semiconductor layer.

20. The method of claim 19, wherein the semiconductor layer has a hard mask disposed thereon, wherein the hard mask comprises a layer of pad oxide having a layer of silicon nitride disposed thereon, wherein the trench extends through the hard mask, and wherein the second etch removes a portion of the pad oxide.

21. The method of claim 19, wherein the second etch is an essentially isotropic etch.

22. The method of claim 21, wherein the first etch is a dry etch, and wherein the second etch is a wet etch utilizing aqueous HF.

23. A method for imparting stress to the channel region of a semiconductor device, comprising:
providing a semiconductor layer disposed on an insulating layer;
creating a trench which extends through the semiconductor layer and into the insulating layer;
backfilling the trench with a tensile stressor material; and
creating a channel region adjacent to the backfilled trench.

24. The method of claim 23, wherein the semiconductor device is an NMOS transistor.

25. The method of claim 23, further comprising:
subjecting the stressor material to densification.

26. The method of claim 25, wherein the stressor material imparts tensile stress by undergoing shrinkage during densification.

27. The method of claim 23, wherein the semiconductor layer has a hard mask disposed thereon, and wherein the trench extends through the hard mask.

28. The method of claim 27, wherein the hard mask comprises a layer of pad oxide having a layer of silicon nitride disposed thereon.

29. A method for imparting stress to the channel region of a semiconductor device, comprising:
providing a semiconductor layer disposed on an insulating layer;
creating a trench which extends through the semiconductor layer and into the insulating layer;
backfilling the trench with a stressor material; and
creating a channel region adjacent to the backfilled trench;
wherein the semiconductor layer has a hard mask disposed thereon, wherein the trench extends through the hard mask, and wherein the hard mask comprises a layer of pad oxide having a layer of silicon nitride disposed thereon.

30. The method of claim 29, wherein the stressor material is a tensile stressor.

31. The method of claim 29, wherein the step of backfilling the trench results in the formation of a trench isolation structure.

* * * * *